(12) United States Patent
Sasaki et al.

(10) Patent No.: US 12,512,391 B2
(45) Date of Patent: Dec. 30, 2025

(54) SEMICONDUCTOR DEVICE

(71) Applicant: RENESAS ELECTRONICS CORPORATION, Tokyo (JP)

(72) Inventors: Hideki Sasaki, Tokyo (JP); Tatsuaki Tsukuda, Tokyo (JP); Hiroya Shimoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 592 days.

(21) Appl. No.: 17/894,572

(22) Filed: Aug. 24, 2022

(65) Prior Publication Data

US 2023/0144840 A1 May 11, 2023

(30) Foreign Application Priority Data

Nov. 8, 2021 (JP) .................. 2021-181866

(51) Int. Cl.
*H01L 23/48* (2006.01)
*H01L 23/00* (2006.01)
*H01L 23/495* (2006.01)
*H01L 25/07* (2006.01)

(52) U.S. Cl.
CPC ...... *H01L 23/481* (2013.01); *H01L 23/49513* (2013.01); *H01L 24/29* (2013.01); *H01L 25/074* (2013.01); *H01L 2224/29139* (2013.01)

(58) Field of Classification Search
CPC ................. H01L 25/072; H01L 25/074; H01L 23/49541; H01L 23/49575; H01L 23/49562; H01L 23/481; H01L 23/49513; H01L 23/49524; H01L 2924/13072–13076; H01L 29/7815; H01L 25/16; H10D 30/669; H10D 30/668; H02M 7/003; H02M 7/5387
See application file for complete search history.

(56) References Cited

U.S. PATENT DOCUMENTS

| | | | |
|---|---|---|---|
| 9,425,788 B1 * | 8/2016 | Jin ...................... | H01L 29/7835 |
| 10,204,849 B2 | 2/2019 | Nakamura et al. | |
| 2011/0210956 A1 * | 9/2011 | Girdhar ................ | H01L 27/088 |
| | | | 345/212 |
| 2013/0082334 A1 | 4/2013 | Nakamura et al. | |

FOREIGN PATENT DOCUMENTS

| | | |
|---|---|---|
| JP | 2013-074264 A | 4/2013 |
| JP | 2018-121035 A | 8/2018 |
| JP | 2020-145219 A | 9/2020 |

OTHER PUBLICATIONS

Office Action dated Nov. 5, 2024, from corresponding Japanese Patent Application No. 2021-181866, 7 pages.

* cited by examiner

*Primary Examiner* — Julio J Maldonado
*Assistant Examiner* — Stanetta D Isaac
(74) *Attorney, Agent, or Firm* — Rimon P.C.

(57) ABSTRACT

A semiconductor device includes a semiconductor chip hazing a non-overlapping region in which a source pad for main transistor and a clip do not overlap with each other. At this time, a sense transistor is arranged in a region of the non-overlapping region, which is located between a first portion of the clip and a first short side of the source pad for main transistor in a plan view.

11 Claims, 14 Drawing Sheets

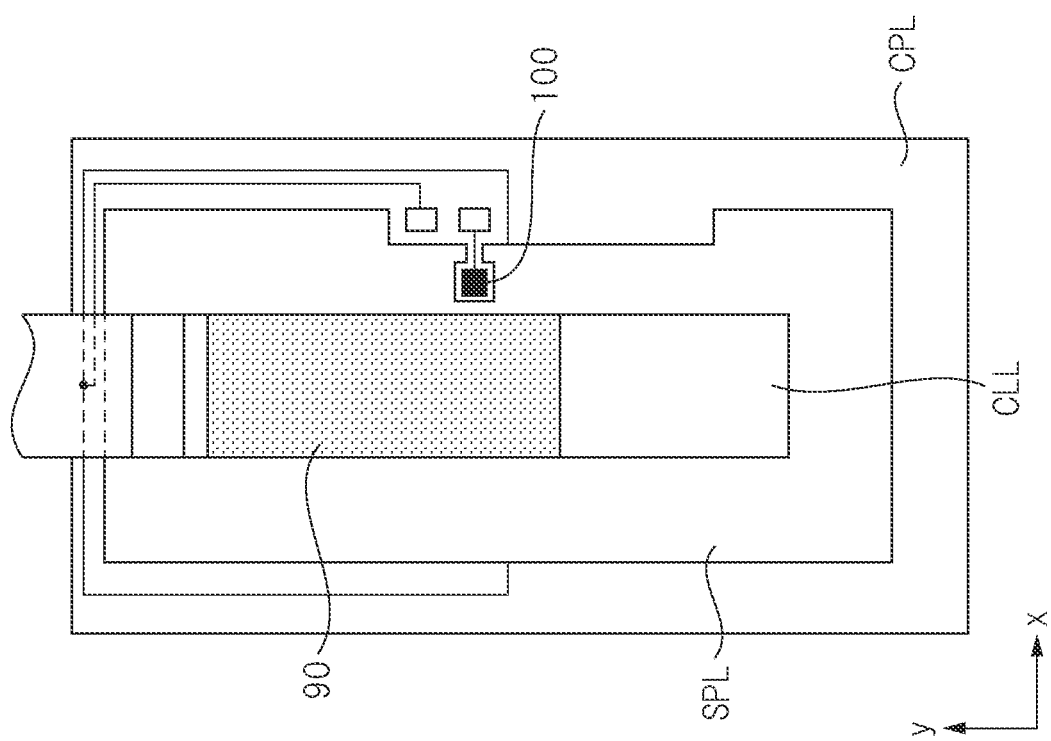
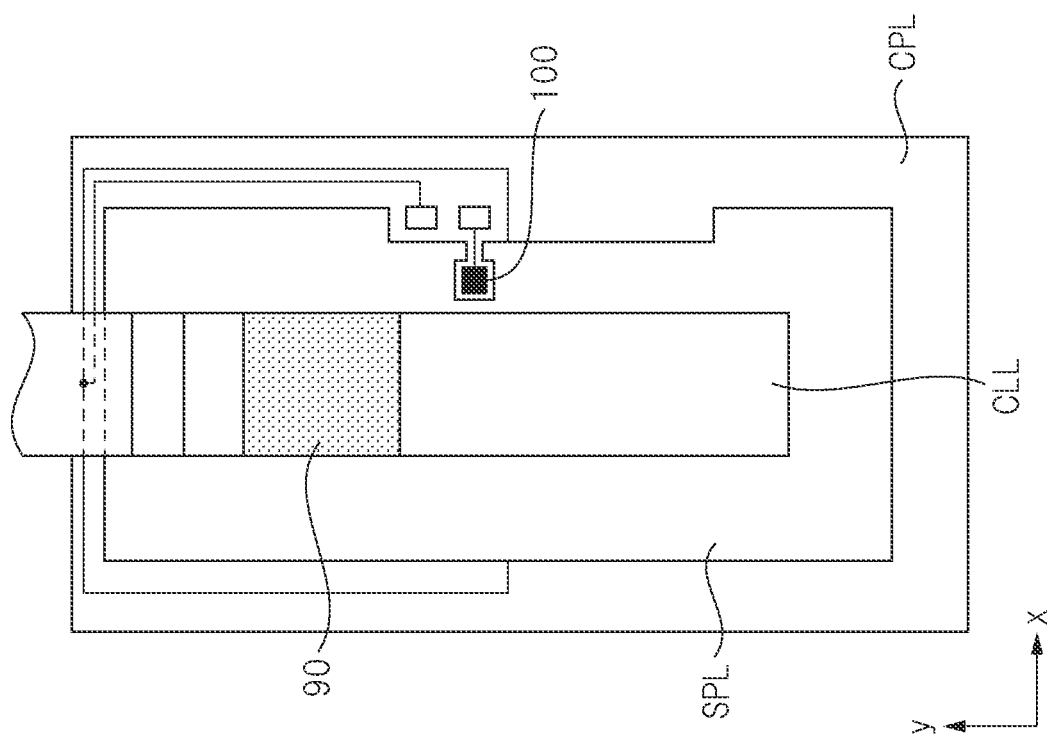

SEMICONDUCTOR DEVICE

CROSS-REFERENCE TO RELATED APPLICATIONS

The disclosure of Japanese Patent Application No. 2021-181866 filed on Nov. 8, 2021 including the specification, drawings and abstract is incorporated herein by reference in its entirety.

BACKGROUND

The present invention relates to a semiconductor device, and relates to, for example, a technology effectively applied to a semiconductor device to be a component of an inverter.

There are disclosed techniques listed below.
[Patent Document 1] Japanese Unexamined Patent Application Publication No. 2018-121035

Japanese Unexamined Patent Application Publication No. 2018-121035 (Patent Document 1) describes a technology relating to a package structure of a semiconductor device to be a component of an inverter.

SUMMARY

For example, as a semiconductor device in which a semiconductor chip having a power transistor formed therein is sealed, there is a semiconductor device in which a lead and an electrode called a pad formed on a surface of the semiconductor chip are connected by a plate-shaped member called a "clip".

The plate-shaped member and the pad are connected via, for example, a conductive member typified by silver paste or solder. Here, peeling sometimes occurs in the conductive member due to the manufacturing process of the semiconductor device. Further, the inventors of this application have newly found that the peeling area fluctuates after the reliability test of the semiconductor device and the fluctuation of the peeling area adversely affects the performance of the semiconductor device in some cases. Therefore, based on the new finding by the inventors of this application, it is desired to devise a method capable of reducing the adverse effect on the performance of the semiconductor device even if the peeling area fluctuates.

A semiconductor device according to an embodiment includes a semiconductor chip having a non-overlapping region in which a first electrode and a plate-shaped member do not overlap with each other. At this time, a sense transistor is arranged in a first region of the non-overlapping region, which is located between a first portion of the plate-shaped member and a first short side of the first electrode in a plan view.

According to the embodiment, it is possible to suppress the deterioration of the performance of the semiconductor device.

BRIEF DESCRIPTION OF THE DRAWINGS

FIG. 6A and FIG. 6B are diagrams for describing the room for improvement existing in a related art.

DETAILED DESCRIPTION

Figure 1:
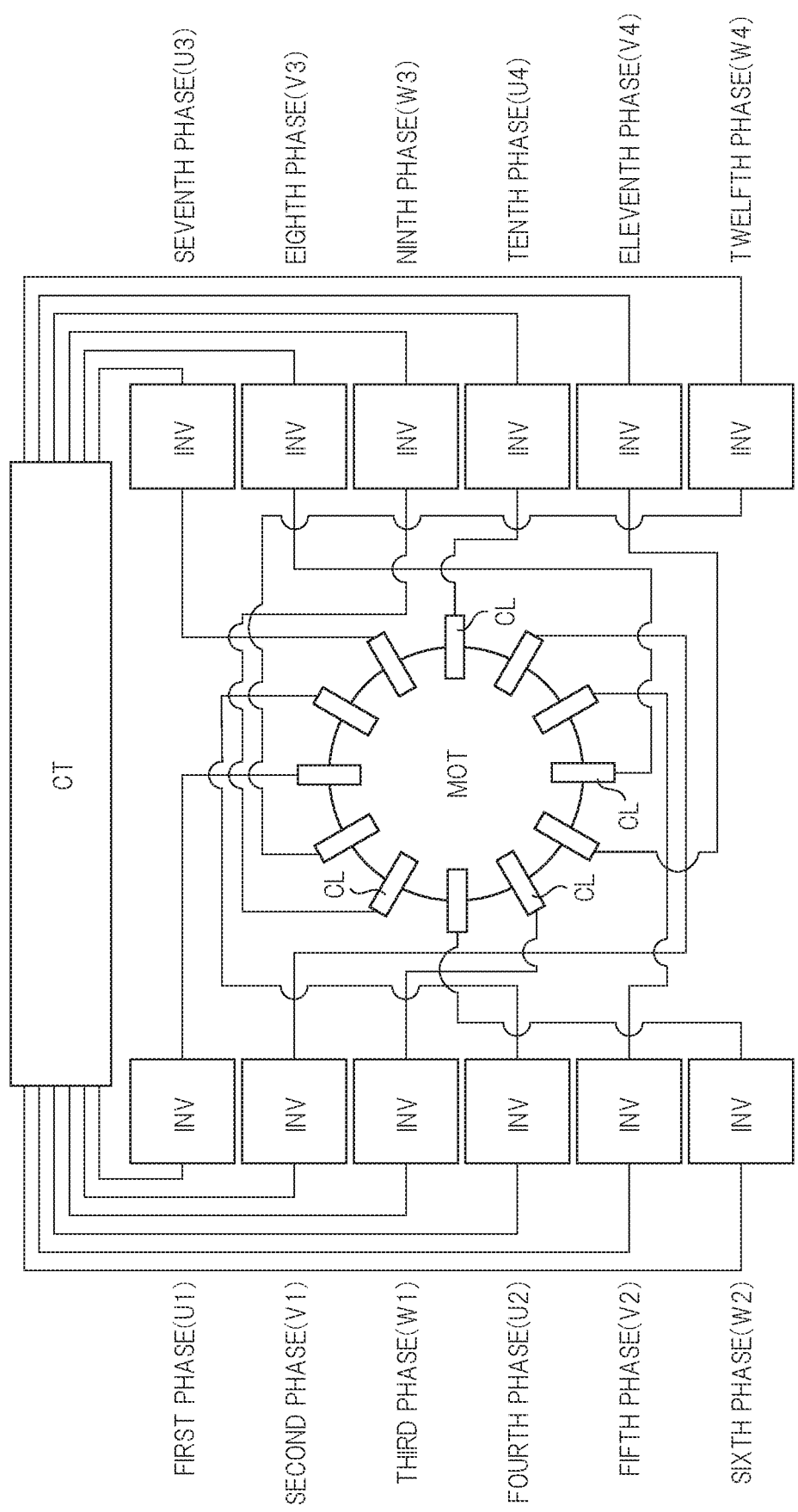
FIG. 1 is a diagram schematically showing a configuration of a 12-phase brushless DC motor control system.

In all the drawings for describing the embodiment, the same members are denoted by the same reference characters and the repetitive description thereof will be omitted. Note that hatching is applied in some cases even in a plan view so as to make the drawing easily understood.

<12-Phase Brushless DC Motor Control System>

In recent years, with a view to functional safety toward the practical application of automated driving of automobiles, design and development have been carried out to replace the conventional 3-phase brushless DC motor with a 6-phase or 12-phase brushless DC motor. Brushless DC motors are generally perceived as complicated to control because they are not of the self-rectifying type. Therefore, two sets of conventional three phases (U-phase. V-phase, and W-phase) are used in the 6-phase brushless DC motor control system that controls the 6-phase brushless DC motor, and four sets of conventional three phases (U phase, V phase, W phase) are used in the 12-phase brushless DC motor control system that controls the 12-phase brushless DC motor, thereby preventing the problem from being apparent immediately even if the problem occurs in one set.

An inverter circuit is used as a circuit that controls each phase, and AC power supplied from this inverter circuit is supplied to the coils of each phase of the brushless DC motor. Therefore, in a brushless DC motor control system that controls a 6-phase brushless DC motor or a 12-phase brushless DC motor, six or twelve inverter circuits are used.

FIG. 1 is a diagram schematically showing a configuration of a 12-phase brushless DC motor control system.

A motor MOT shown in FIG. 1 is a 12-phase brushless DC motor and has twelve coils CL. Each coil CL is connected to an inverter circuit INV. Namely, the inverter circuit INV is provided for each of the twelve coils of the motor MOT. For this reason, the 12-phase brushless DC motor control system shown in FIG. 1 has a total of twelve inverter circuits INV. Each inverter circuit INV is connected to a control circuit CT provided in an MCU (Micro Controller Unit), and each inverter circuit is controlled by this control circuit CT. Then, AC power is supplied from each inverter circuit INV controlled by the control circuit CT to the coil CL connected to each inverter circuit INV, whereby the motor MOT is driven.

<Configuration of Inverter Circuit>

Next, a circuit configuration of the inverter circuit INV that is a component of the above-mentioned 12-phase brushless DC motor control system will be described.

Figure 2:
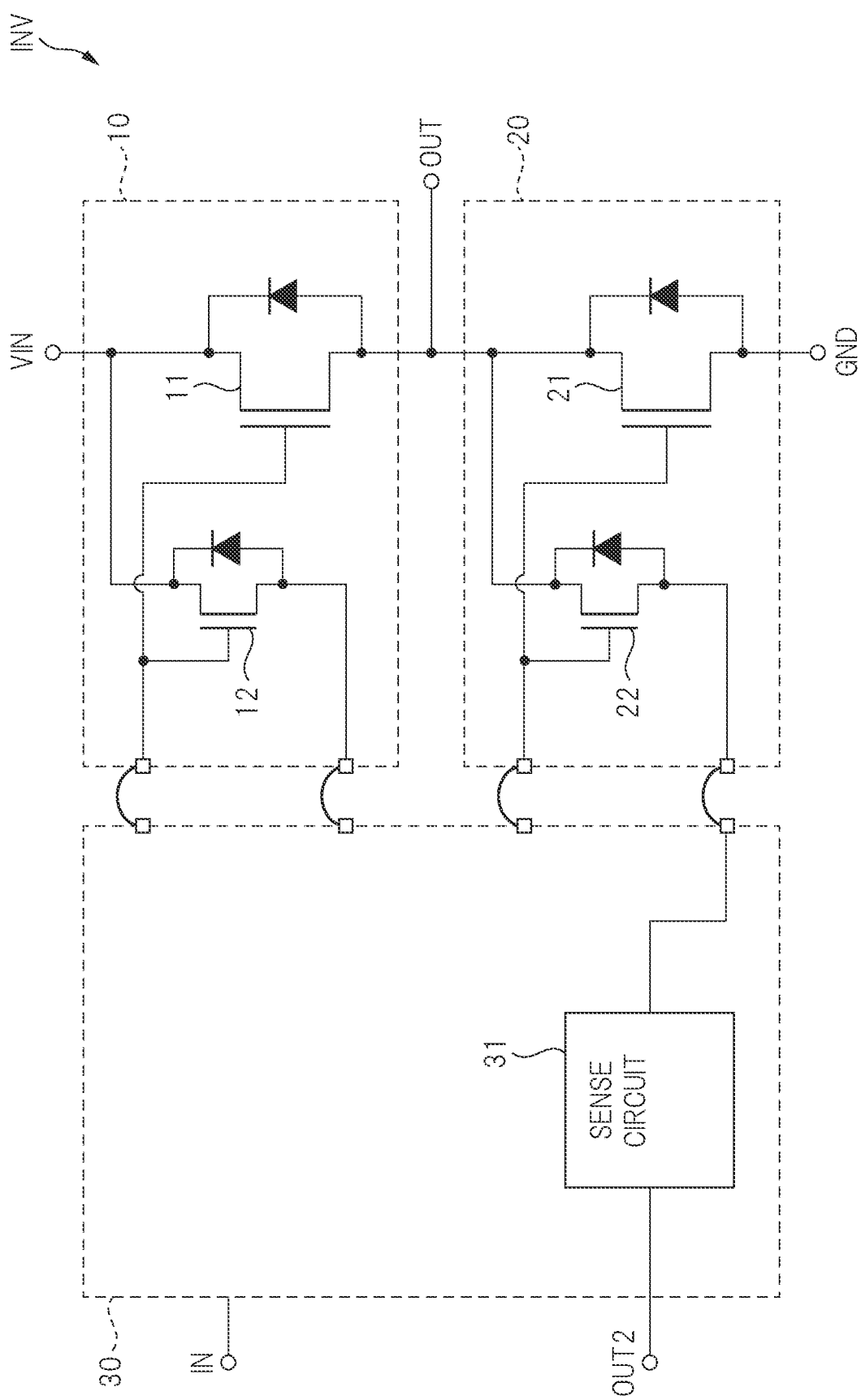
FIG. 2 is a diagram showing a circuit configuration of an inverter circuit.

FIG. 2 is a diagram showing the circuit configuration of the inverter circuit INV.

In FIG. 2, the inverter circuit INV includes a high-side switching circuit 10, a low-side switching circuit 20, and a control circuit 30.

The high-side switching circuit 10 includes a main transistor 11 and a sense transistor 12 each composed of a power transistor.

On the other hand, the low-side switching circuit 20 includes a main transistor 21 and a sense transistor 22 each composed of a power transistor.

In the high-side switching circuit 10 and the low-side switching circuit 20 configured in this way, the main transistor 11 included in the high-side switching circuit 10 and the main transistor 21 included in the low-side switching circuit 20 are connected in series between a power supply potential VIN and a ground potential GND.

Then, in FIG. 2, a connection node between the main transistor 11 and the main transistor 21 is "OUT", and this connection node is connected to the coil CL shown in FIG. 1.

Subsequently, the control circuit 30 includes, for example, a predriver that applies a gate voltage to a gate electrode of the main transistor 11 and a gate electrode of the sense transistor 12 and a predriver that applies a gate voltage to a gate electrode of the main transistor 21 and a gate electrode of the sense transistor 22. Further, the control circuit 30 includes a sense circuit 31 electrically connected to the sense transistor 22 included in the low-side switching circuit 20.

In FIG. 2, though the sense circuit 31 electrically connected to the sense transistor 22 included in the low-side switching circuit 20 is provided, for example, the sense transistor 12 included in the high-side switching circuit 10 is not used, and a sense circuit electrically connected to the sense transistor 12 included in the high-side switching circuit 10 is not present. However, the inverter circuit INV is not limited to this, and may be configured to have, for example, the sense circuit 31 electrically connected to the sense transistor 22 included in the low-side switching circuit 20 and the sense circuit electrically connected to the sense transistor 12 included in the high-side switching circuit 10. Further, the inverter circuit INV may have the configuration in which the sense circuit 31 electrically connected to the sense transistor 22 included in the low-side switching circuit 20 is not present and the sense circuit electrically connected to the sense transistor 12 included in the high-side switching circuit 10 is provided.

Also, in FIG. 2, an input node that inputs a control signal from the control circuit CT shown in FIG. 1 to the control circuit 30 is "IN", and an output node that outputs an output signal from the sense circuit 31 of the control circuit 30 is "OUT2". This output node is electrically connected to the control circuit CT shown in FIG. 1. In this way, the inverter circuit INV is configured.

The control circuit 30 is configured to control the on/off of the main transistor 11 included in the high-side switching circuit 10 and control the on/off of the main transistor 21 included in the low-side switching circuit 20 based on the control signal from the control circuit CT shown in FIG. 1. Namely, the control circuit 30 controls the on/off of the main transistor 11 by switching the gate voltage applied to the gate electrode of the main transistor 11, and also controls the on/off of the main transistor 21 by switching the gate voltage applied to the gate electrode of the main transistor 21.

In this way, by the on/off control of the main transistor 11 and the on/off control of the main transistor 21, AC power is supplied to the coil CL shown in FIG. 1 from the connection node ("OUT") between the main transistor 11 and the main transistor 21.

Here, the sense transistor 22 included in the low-side switching circuit 20 is provided in order to detect the current value of the current flowing through the main transistor 21.

For example, the main transistor 21 and the sense transistor 22 form a current mirror circuit such that the ratio between the current value of the current flowing through the main transistor 21 and the current value of the current flowing through the sense transistor 22 is equal to 12500:1 (sense ratio).

Also, the sense transistor 22 is electrically connected to the sense circuit 31, and the current flowing through the sense transistor 22 is converted into a voltage by the sense circuit 31 and is then output to the control circuit CT shown in FIG. 1 from the output node "OUT2". At this time, in the control circuit CT shown in FIG. 1, the current value of the current flowing through the main transistor 21 is measured based on the voltage signal input from "OUT2" and the "sense ratio".

In this way, the inverter circuit INV is configured.

<Package Structure>

Next, a mounting configuration of the inverter circuit INV will be described.

Figure 3:
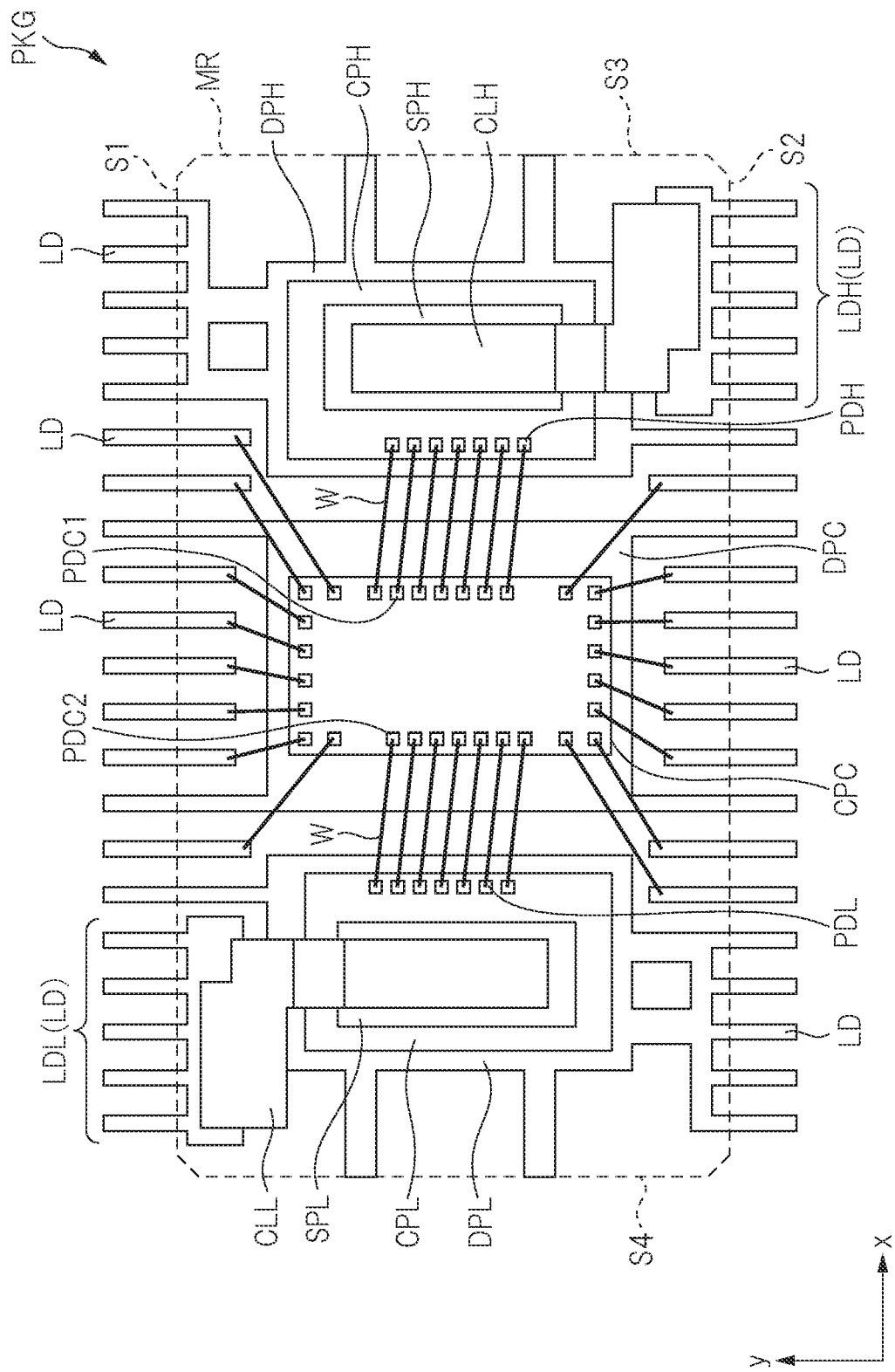
FIG. 3 is a diagram showing a mounting configuration of a semiconductor device that realizes an inverter circuit.

FIG. 3 is a diagram showing a mounting configuration of a semiconductor device PKG that realizes an inverter circuit.

In FIG. 3, the semiconductor device PKG has a sealing body MR with a rectangular planar shape. This sealing body MR has a side S1 that is a long side, a side S2 that faces the side S1, a side S3 that is a short side intersecting the side S1 and the side S2, and a side S4 that faces the side S3. Also, leads LD protrude from the long sides S1 and S2.

In FIG. 3, the outline of the sealing body MR is shown by a broken line, and components sealed inside the sealing body MR are illustrated. Hereinafter, the internal configuration of the sealing body MR will be described.

The semiconductor device PKG includes a die pad DPC which is a chip mounting portion, a die pad DPL which is a chip mounting portion, and a die pad DPH which is a chip mounting portion. Specifically, the die pad DPL, the die pad DPC, and the die pad DPH are disposed so as to be arranged in this order in the x direction. In other words, the die pad DPL is arranged on the left side, the die pad DPC is arranged in a central portion, and the die pad DPH is arranged on the right side.

A semiconductor chip CPC mounted on the die pad DPC. The control circuit 30 shown in FIG. 2 is formed in the semiconductor chip CPC. Then, on the surface of the semiconductor chip CPC, for example, a plurality of pads including a plurality of pads PDC1 and a plurality of pads PDC2 is formed. As described above, the semiconductor chip CPC mounted on the die pad DPC is arranged in the central portion of the semiconductor device PKG.

Next, a semiconductor chip CPL is mounted on the die pad DPL. The low-side switching circuit 20 shown in FIG. 2 is formed in the semiconductor chip CPL. Namely, the main transistor 21 and the sense transistor 22 constituting the low-side switching circuit 20 are formed in the semiconductor chip CPL. The main transistor 21 and the sense transistor 22 are composed of vertical trench power transistors which flow a current in the thickness direction of the semiconductor chip CPL. Also, a plurality of pads PDL is formed on the surface of the semiconductor chip CPL together with a source pad SPL for main transistor. The plurality of pads PDL includes a source pad for sense transistor, a gate pad common to the main transistor 21 and the sense transistor 22, and others.

Further, as shown in FIG. 3, a clip CLL which is a plate-shaped member made of copper is arranged on the source pad SPL for main transistor. Further, as shown in FIG. 3, the lip CLL is electrically connected to a lead LDL. On the other hand, each of the plurality of pads PDL is electrically connected to each of the plurality of pads PDC2 formed on the surface of the semiconductor chip CPC by the bonding wire W.

Subsequently, a semiconductor chip CPH is mounted on the die pad DPH. The high-side switching circuit 10 shown in FIG. 2 is formed in the semiconductor chip CPH. Namely, the main transistor 11 and the sense transistor 12 constituting the high-side switching circuit 10 are formed in the semiconductor chip CPH. The main transistor 11 and the sense transistor 12 are composed of vertical trench power transistors which flow a current in the thickness direction of the semiconductor chip CPH. Also, a plurality of pads PDH is formed on the surface of the semiconductor chip CPH together with a source pad SPH for main transistor. The plurality of pads PDH includes a source pad for sense transistor, a gate pad common to the main transistor 11 and the sense transistor 12, and others.

Further, as shown in FIG. 3, a clip CLH which is a plate-shaped member made of copper is arranged on the source pad SPH for main transistor. Further, as shown in FIG. 3, the clip SPH is electrically connected to a lead LDH. On the other hand, each of the plurality of pads PDH is electrically connected to each of the plurality of pads PDC1 formed on the surface of the semiconductor chip CPC by the bonding wire W.

In the present embodiment, the planar shape of the semiconductor device PKG is a substantially rectangular shape (specifically, a rectangle in which each corner is chamfered) as shown in FIG. 3. Further, in the present embodiment, the planar shape of each semiconductor chip is also a rectangular shape as shown in FIG. 3. Then, in the present embodiment, as shown in FIG. 3, the semiconductor chip CPC, the semiconductor chip CPL, and the semiconductor chip CPH are arranged such that the short side of each semiconductor chip is located along the long side of the semiconductor device PKG. In this way, the size of each semiconductor chip and the size of the semiconductor device PKG are reduced.

In the present embodiment, the semiconductor chip CPL in which the low-side switching circuit 20 is formed and the semiconductor chip CPH in which the high-side switching circuit 10 is formed are semiconductor chips of the same type.

As described above, the semiconductor device PKG composed of an SiP (System in Package) in which the semiconductor chip CPC, the semiconductor chip CPL, and the semiconductor chip CPH in which circuits constituting the inverter circuit INV are formed are mounted in one package structure is implemented and configured.

<Consideration of Improvement>

In the following, the room for improvement in the semiconductor device PKG will be described while taking the clip CLL as the plate-shaped member.

In the above-mentioned semiconductor device PKG, from the viewpoint of improving heat dissipation efficiency, a configuration in which the back surface of the die pad DPL (die pad DPC, die pad DPH) is exposed from the lower surface of the sealing body MR is adopted in some cases. In the semiconductor device PKG having such a configuration, the inventors of this application have newly found that there is a room for improvement shown below.

Figure 4:
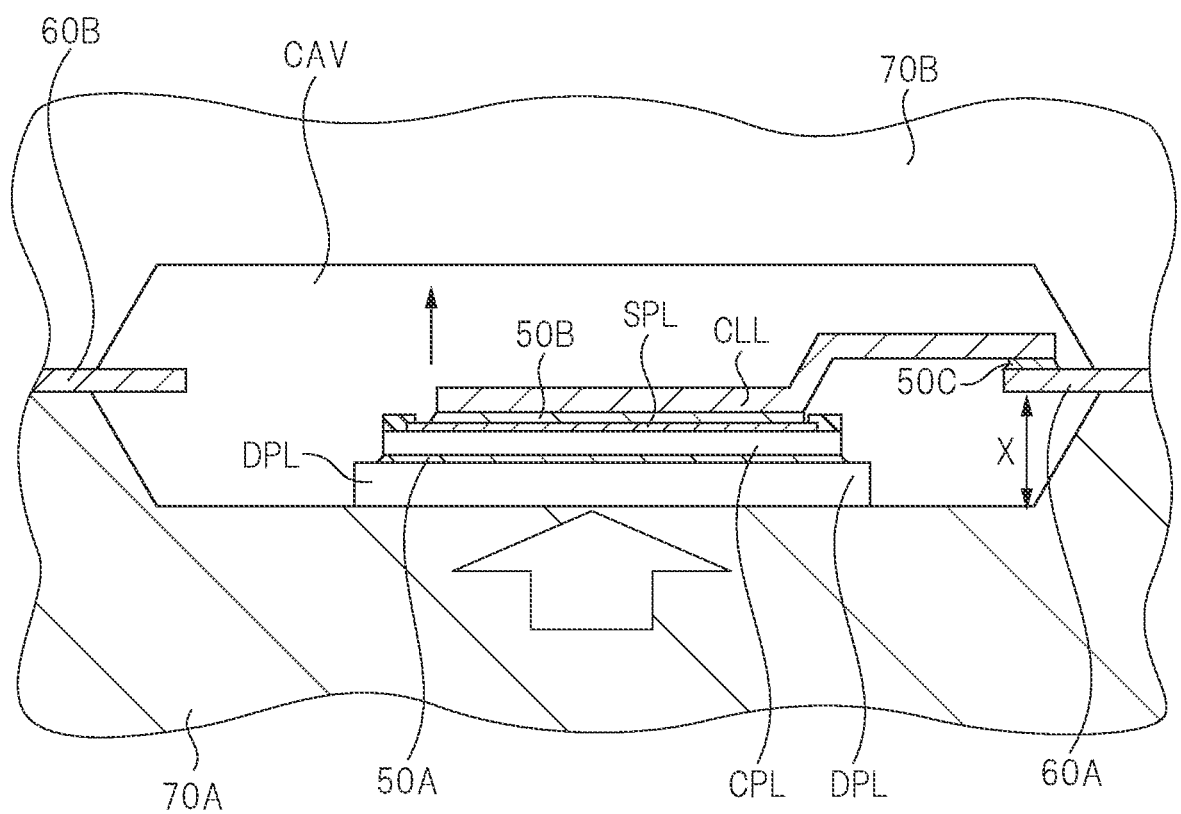
FIG. 4 is a diagram for describing the room for improvement newly found by the inventors of this application, and is a cross-sectional view showing a molding step for forming a sealing body.

FIG. 4 is a diagram for describing the room for improvement newly found by the inventors of this application, and is a cross-sectional view showing a molding step for forming the sealing body MR. In FIG. 4, a lead 60A and a lead 60B in the lead frame are sandwiched between a lower mold 70A and an upper mold 70B. Then, the die pad DPL, the semiconductor chip CPL mounted on the die pad DPL via a silver paste 50A, and the clip CLL mounted via a silver paste 50B on the source pad SPL for main transistor formed on the semiconductor chip CPL are mounted in the cavity CAV. Further, the clip CLL is connected to the lead 60A via a silver paste 50C. Namely, the clip CLL has a function of electrically connecting the source pad SPL for main transistor and the lead 60A.

Here, in the molding step shown in FIG. 4, the sealing body is formed by injecting a resin into the cavity CAV. At this time, if there is a gap between the lower mold 70A and the die pad DPL in FIG. 4, the resin also flows into this gap. Thus, in order to prevent the formation of the gap into which the resin flows between the lower mold 70A and the die pad DPL, for example, the molding step is performed while applying the force of pushing the die pad DPL from the lower mold 70A toward the cavity CAV as shown in FIG. 4.

In this case, the lead 60A and the lead 60B are sandwiched and fixed between the lower mold 70A and the upper mold 70B. On the other hand, the die pad DPL is pushed toward the cavity CAV by the above-mentioned pushing force. As a result, the "offset X" indicating the height difference between the lead 60A (60B) and the die pad DPL shown in FIG. 4 changes to be smaller. Then, a force in the direction indicated by the arrow in FIG. 4 is applied to the clip CLL connected to both the lead 60A and the semiconductor chip CPL.

Figure 5:
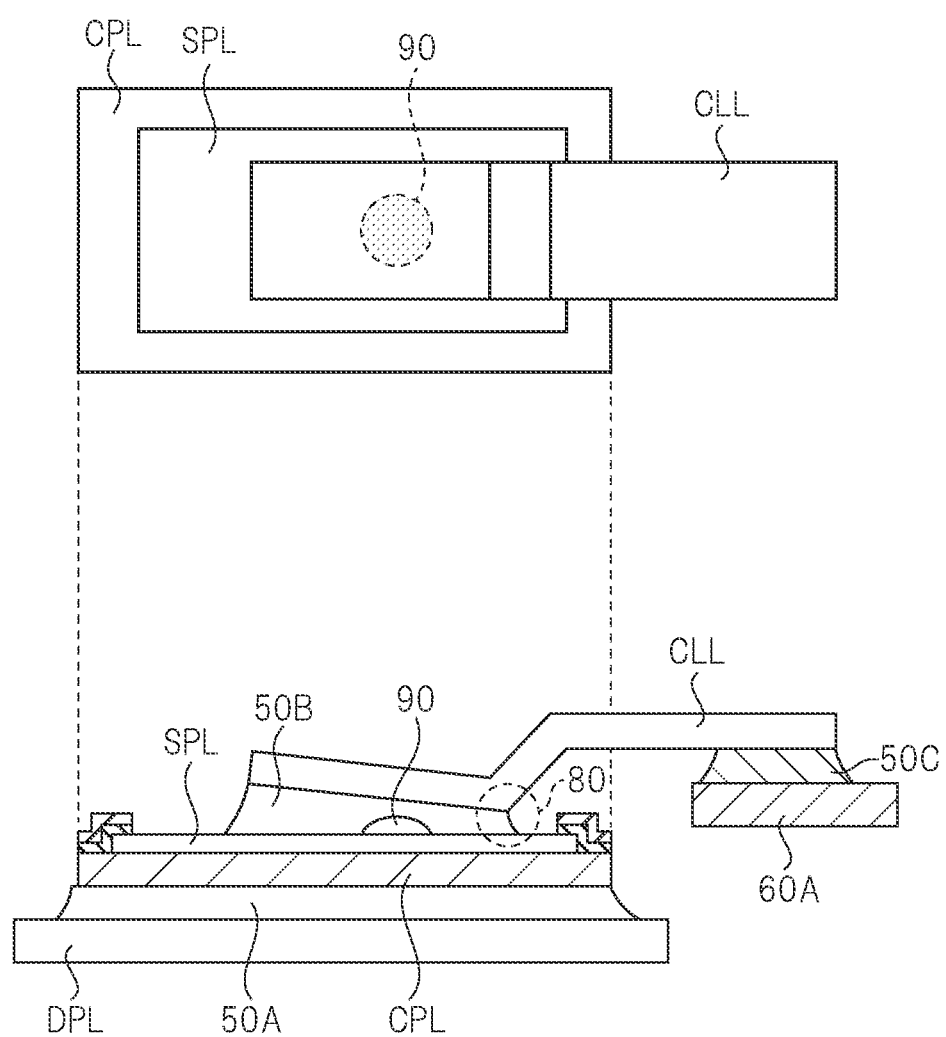
FIG. 5 is a diagram showing a state in which a clip is "reversely tilted".

This causes the deformation of the clip CLL, for example, as shown in FIG. 5. Specifically, the clip CLL connected to both the source pad SPL for main transistor formed on the semiconductor chip CPL and the lead 60A is arranged in parallel to the semiconductor chip CPL in general, but the deformation in which the tip portion of the clip CLL becomes higher than the root portion of the clip occurs due to the pushing force applied to the die pad DPL described above.

In this specification, the shape in which the tip portion of the clip CLL is higher than the root portion of the clip CLL shown in FIG. 5 is referred to as "reverse tilt".

As described above, in the molding step for manufacturing the semiconductor device PKG in which the back surface of the die pad DPL is exposed from the lower surface of the sealing body MR, a pushing force is applied to the die pad DPL from the lower die 70A toward the cavity CAV such that a gap into which the resin flows is not formed between the lower mold 70A and the die pad DPL. As a result, for example, as shown in FIG. 5, the shape of the clip CLL becomes the "reverse tilt".

Then, when the shape of the clip CLL becomes the "reverse tilt", the portion of the silver paste 50B in contact with the root portion 80 of the clip CLL becomes thinner than the other portion of the silver paste 50B. As a result, due to the structural stress applied to the semiconductor device, for example, a peeled portion 90 is generated in the silver paste 50B shown in FIG. 5.

In this regard, the silver paste 50B has a function of electrically connecting the source pad SPL for main transistor formed on the semiconductor chip CPL and the clip CLL, and serves as a current path through which a current flows. For this reason, when peeling occurs in the silver paste 50B serving as the current path, the peeled portion 90 becomes a high impedance region, so that the on-resistance of the semiconductor device becomes high. Further, in the case of a semiconductor device provided with a sense transistor, it causes the fluctuation in the sense ratio. Namely, the occurrence of peeling in the silver paste 50B adversely affects the performance of the semiconductor device.

In the foregoing, the room for improvement in the semiconductor device PKG has been described while taking the clip CLL as the plate-shaped member. This is because, for example, the inverter circuit INV shown in FIG. 2 has the sense circuit 31 electrically connected to the sense transistor 22 included in the low-side switching circuit 20 and the main transistor 21 and the sense transistor 22 constituting the low-side switching circuit 20 are formed in the semiconductor chip CPL, so that the plate-shaped member connected to the semiconductor chip CPL via the silver paste 50B is the clip CLL. Therefore, for example, when the inverter circuit INV is configured to have the sense circuit 31 electrically connected to the sense transistor 22 included in the low-side switching circuit 20 and have the sense circuit electrically connected to the sense transistor 12 included in the high-side switching circuit 10, since the main transistor 11 and the sense transistor 12 constituting the high-side switching circuit 10 are formed in the semiconductor chip CPH, the same room for improvement as that of the above-mentioned clip CLL is present also in the clip CLH which is a plate-shaped member connected to the semiconductor chip CPH via the silver paste.

Furthermore, for example, when the inverter circuit INV is configured such that the sense circuit 31 electrically connected to the sense transistor 22 included in the low-side switching circuit 20 is not provided and the sense circuit electrically connected to the sense transistor 12 included in the high-side switching circuit 10 is provided, the room for improvement described above is present for the clip CLH which is a plate-shaped member connected to the semiconductor chip CPAP: via the silver paste.

<New Finding Found by Inventors of This Application>

As described above, the peeling that has occurred in the silver paste 50B serving as the current path causes the fluctuation of the sense ratio in the case of the semiconductor device in which a sense transistor is mounted. Furthermore, the inventors of this application have newly found that the occurrence of peeling itself is also a problem, but in particular, the fluctuation of the sense ratio is greatly affected by the fluctuation of the peeling area.

In the following, this point will be described.

For example, in the manufacturing process of a semiconductor device, a reliability test called HTSL (High Temperature Storage Life) is performed in some cases after the semiconductor device is manufactured. The "HTSL" is a test in which a semiconductor device is stored for a long time at a high temperature and the influence on the semiconductor device is evaluated. In the "HTSL", since the semiconductor device is kept in a high temperature state, it is conceivable that the peeling of the silver paste 50B due to, for example, the causes shown in FIG. 4 and FIG. 5 progresses. However, the inventors of this application have newly found that the peeled portion of the silver paste 50B may not only be enlarged but also be re-adhered and reduced by the "HTSL". Namely, according to the study by the inventors of this application, the peeling area of the silver paste 50B is increased or decreased by the "HTSL". Then, when the peeling area of the silver paste 50B increases or decreases, the potential distribution on the surface of the source pad SPL for main transistor changes. As a result, the current flowing through the sense transistor changes, and the sense ratio fluctuates.

From the above, the finding newly found by the inventors of this application is that the peeling area of the silver paste 50B increases or decreases by performing the reliability test called "HTSL" and the potential distribution on the surface of the source pad SPL for main transistor changes due to the increase or decrease in the peeling area, so that the current (sense current) flowing through the sense transistor fluctuates and the sense ratio fluctuates. Then, since the inventors of this application have acquired the finding that the potential change due to the increase or decrease in the peeling area is large in the case of the arrangement position of the sense transistor in the related art and the sense ratio greatly fluctuates due to it, this finding will be described.

The "related art" referred to in this specification is not a known art, but is an art having the problem found by the inventors of this application and serving as a premise of the present invention.

FIG. 6A and FIG. 6B are diagrams for describing the room for improvement existing in the related art.

As shown in FIG. 6A, a sense transistor 100 arranged near the central portion the long side direction of the semiconductor chip CPL. As a result, in the related art, the sense transistor 100 is arranged in the region close to the peeled portion 90. Then, as shown in FIG. 6B, when the peeled portion 90 increases, the sense transistor 100 comes close to the peeled portion 90, and as a result, the sense transistor 100 is greatly affected by the potential change caused by the peeled portion 90. Namely, in the related art, since the sense transistor 100 is formed in the region close to the growing peeled portion 90, the current flowing through the sense transistor 100 fluctuates due to the influence of the potential change caused by the peeled portion 90. Further, the peeled portion 90 that has once grown is reduced by re-adhesion in some cases and a potential change occurs in this case as well, so that the current flowing through the sense transistor 100 fluctuates due to the influence of the potential change.

Namely, in the related art, since the sense transistor 100 is arranged in a region close to the peeled portion 90, the current flowing through the sense transistor 100 is likely to be affected by the potential change due to the increase or decrease of the peeled portion 90. In other words, in the related art, the sense transistor 100 is arranged at a position that is likely to be affected by the potential change due to the increase or decrease of the peeled portion 90. For this reason, in the related art, the potential change due to the increase or decrease of the peeled portion 90 is large, and the sense ratio is greatly changed due to it. This means that the sense ratio deviates from a preset value and the detection accuracy of the current (main current) flowing through the main transistor is lowered due to it. As described above, from the viewpoint of suppressing the fluctuation of the sense ratio, the related art has the room for improvement in the point that the sense transistor 100 is arranged at the position where the potential change due to the increase or decrease of the peeled portion 90 is large.

Therefore, in the present embodiment, measures are taken to overcome the room for improvement existing in the related art. Hereinafter, the technical idea in the present embodiment in which the measures are taken will be described.

<Basic Idea in Embodiment>

The basic idea in the present embodiment is that the sense transistor is formed at the position that is less likely to be affected by the potential change due to the increase or decrease of the peeled portion of the silver paste. According to this basic idea, for example, the sense transistor becomes less likely to be affected by the potential change due to the increase or decrease of the peeled portion even if the peeled portion of the silver paste that adheres the source pad for main transistor and the clip increases or decreases by performing the reliability test called "HTSL". As a result, according to the basic idea, since the fluctuation of the sense ratio can be suppressed, the detection accuracy of the current (main current) flowing through the main transistor can be improved. Namely, according to the basic idea, it is possible to suppress the deterioration of the performance of the semiconductor device such as the decrease in the detection accuracy of the main current due to the fluctuation of the sense ratio.

In the following, the embodied mode obtained from the above-mentioned basic idea will be described.

<Embodied Mode>

The basic idea is that a sense transistor is formed at the position that is less likely to be affected by the potential change due to the increase or decrease of the peeled portion of the silver paste, and it is important to find the "position that is less likely to be affected by the potential change due to the increase or decrease of the peeled portion of the silver paste" in order to embody the basic idea.

In this regard, since the inventors of this application have found the following position as the "position that is less likely to be affected by the potential change due to the increase or decrease of the peeled portion of the silver paste", the position will be described below.

Figure 7:
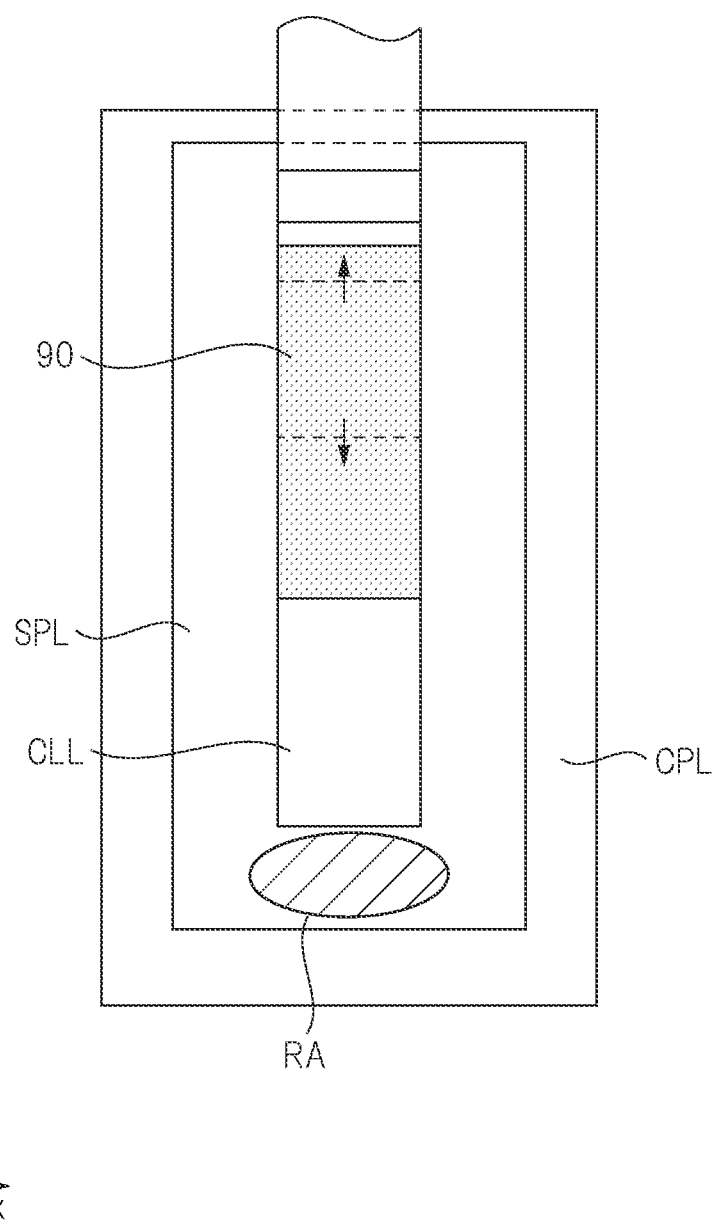
FIG. 7 is a diagram schematically showing the "position that is less likely to be affected by the potential change due to increase or decrease of the peeled portion of silver paste".

FIG. 7 is a diagram schematically showing the "position that is less likely to be affected by the potential change due to the increase or decrease of the peeled portion of the silver paste". In FIG. 7, a region RA is located at a position away from the peeled portion 90 of the silver paste, and corresponds to the "position that is less likely to be affected by the potential change due to the increase or decrease of the peeled portion of the silver paste". Accordingly, the sense transistor is arranged in the region RA in the present embodiment.

The details will be described below.

First, as shown in FIG. 3, the semiconductor device PKG includes the die pad DPL, the semiconductor chip CPL mounted on the die pad DPL, the lead LD arranged separately from the die pad DPL, and the clip CLL that electrically connects the semiconductor chip CPL and the lead LD. The clip CLL is an example of a plate-shaped member, and is made of, for example, copper.

Subsequently, as shown in FIG. 2, for example, the main transistor 21 and the sense transistor 22 constituting the low-side switching circuit 20 are formed in the semiconductor chip CPL. The main transistor 21 and the sense transistor 22 are composed of vertical trench power transistors which flow a current in the thickness direction of the semiconductor chip CPL.

Figure 8:
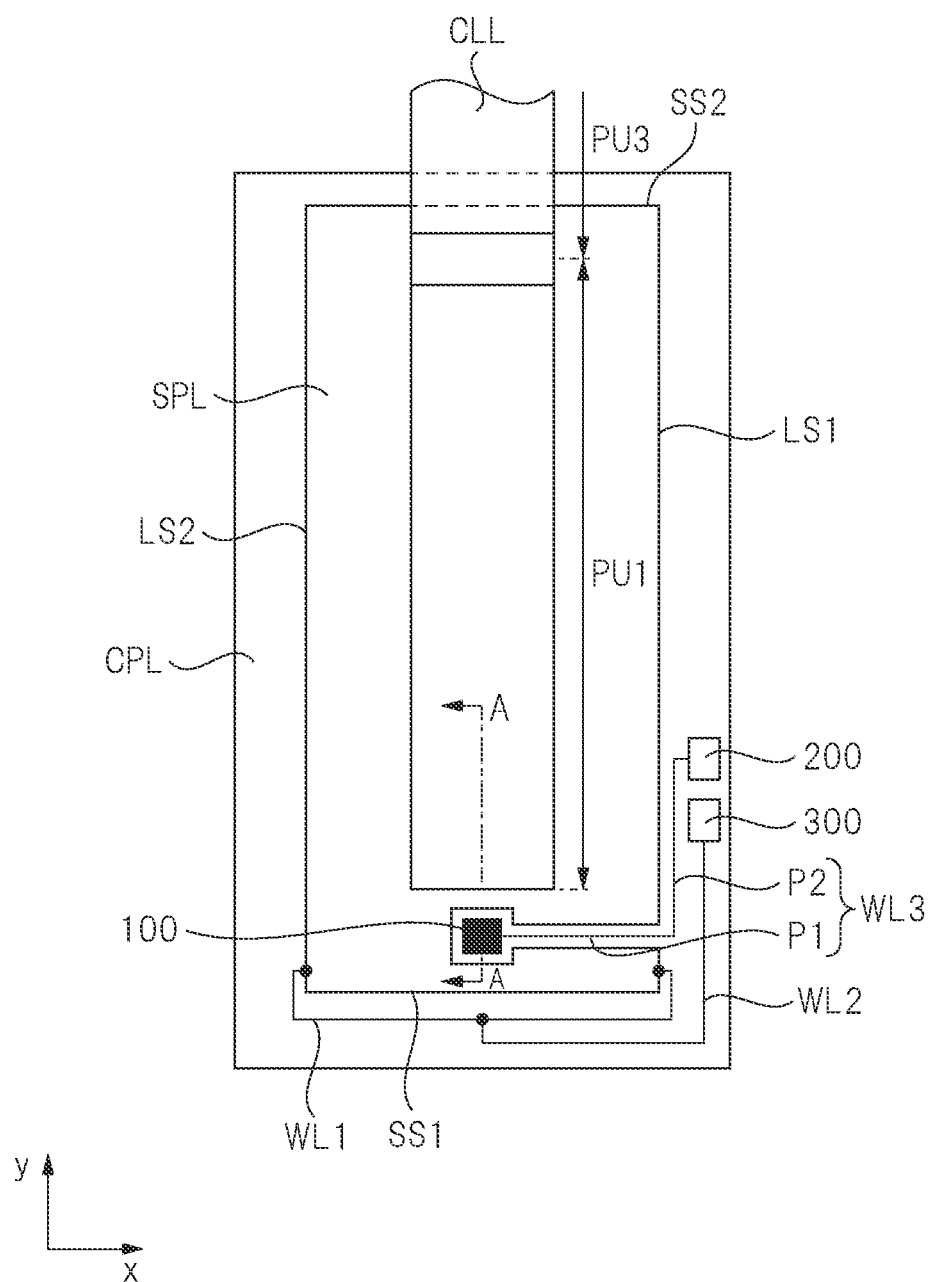
FIG. 8 is a diagram showing an embodied mode obtained from a basic idea.

Then, as shown in FIG. 8, the source pad SPL for main transistor electrically connected to the power transistor (main transistor 21 in FIG. 2) and a sense pad 200 electrically connected to the sense transistor 100 (sense transistor 22 in FIG. 2) are formed on the surface of the semiconductor chip CPL.

Here, as shown in FIG. 8, the source pad SPL for main transistor has a first short side SS1, a second short side SS2 facing the first short side SS1, a first long side LS1 intersecting the first short side SS1, and a second long side LS2 facing the first long side LS1 in a plan view. Also, the semiconductor chip CPL has an overlapping region in which the source pad SPL for main transistor and the clip CLL overlap with each other in a plan view and a non-overlapping region in which the source pad SPL for main transistor and the clip CLL do not overlap with each other. At this time, the clip CLL extends in the y direction (first direction) in which the first long side LS1 and the second long side LS2 extend, crosses the second short side SS2 in a plan view, and is electrically connected to the source pad SPL for main transistor via the silver paste. Further, the non-overlapping region in which the source pad SPL for main transistor and the clip CLL do not overlap with each other includes a region sandwiched between the tip portion of the clip CLL and the first short side SS1 of the source pad SPL for main transistor in a plan view, that is, a region in which the sense transistor 100 is arranged.

Namely, the non-overlapping region includes a first region which is located between a first portion PU1 of the clip CLL (plate-shaped member) and the first short side SS1 of the source pad SPL (first electrode) for main transistor in a plan view and in which the sense transistor 100 is arranged. In other words, the sense transistor 100 is located in the first region between the first portion PU1 of the clip CLL (plate-shaped member) and the first short side SS1 of the source pad SPL (first electrode) for main transistor in a plan view, in the non-overlapping region.

Furthermore, as shown in FIG. 8, a pad 300 electrically connected to the source pad SPL for main transistor is formed on the surface of the semiconductor chip CPL. At this time, the source pad SPL for main transistor and the pad 300 are connected via a first wiring WL1 connecting the first long side LS1 and the second long side LS2 of the source pad SPL for main transistor and a second wiring WL2 connecting the first wiring WL1 and the pad 300.

On the other hand, as shown in FIG. 8, the sense transistor 100 and the sense pad 200 are connected by a third wiring WL3. At this time, the third wiring WL3 has a first portion P1 arranged along the first short side SS1 and a second portion P2 arranged along the first long side LS1.

Here, in the semiconductor chip CPC (control chip) shown in FIG. 3, the main current flowing through the main transistor is measured based on the sense current flowing through the sense transistor 100. Specifically, the source voltage of the sense transistor 100 is input to the semiconductor chip CPC from the sense pad 200 electrically connected to the sense transistor 100, and the source voltage of the main transistor is input to the semiconductor chip CPC from the pad 300 electrically connected to the source pad SPL for main transistor. Then, in the semiconductor chip CPC, after correcting such that the difference between the input source voltage of the sense transistor 100 and the input source voltage of the main transistor becomes zero, in other words, after correcting such that the source voltage of the sense transistor 100 and the source voltage of the main transistor become equal to each other, the sense current input from the sense pad 200 is converted into a voltage signal. In this way, the current value of the main current flowing through the main transistor is measured based on the voltage signal and the preset "sense ratio". In this regard, for example, if there is no increase or decrease of the peeled portion, the sense current value of the sense transistor 100 becomes a desired value, and the measurement accuracy of the main current measured from the preset "sense ratio" is good. On the other hand, if there is the increase or decrease of the peeled portion, the sense current value of the sense transistor 100 changes from a desired value, so that the measurement accuracy of the main current measured based on the preset "sense ratio" is reduced. Therefore, it is important to find the "position that is less likely to be affected by the potential change due to the increase or decrease of the peeled portion of the silver paste", and for example, the sense transistor 100 is arranged in the region sandwiched between the tip portion of the clip CLL and the first short side SS1 the source pad SPL for main transistor in a plan view as shown in FIG. 8 in the present embodiment.

Figure 9:
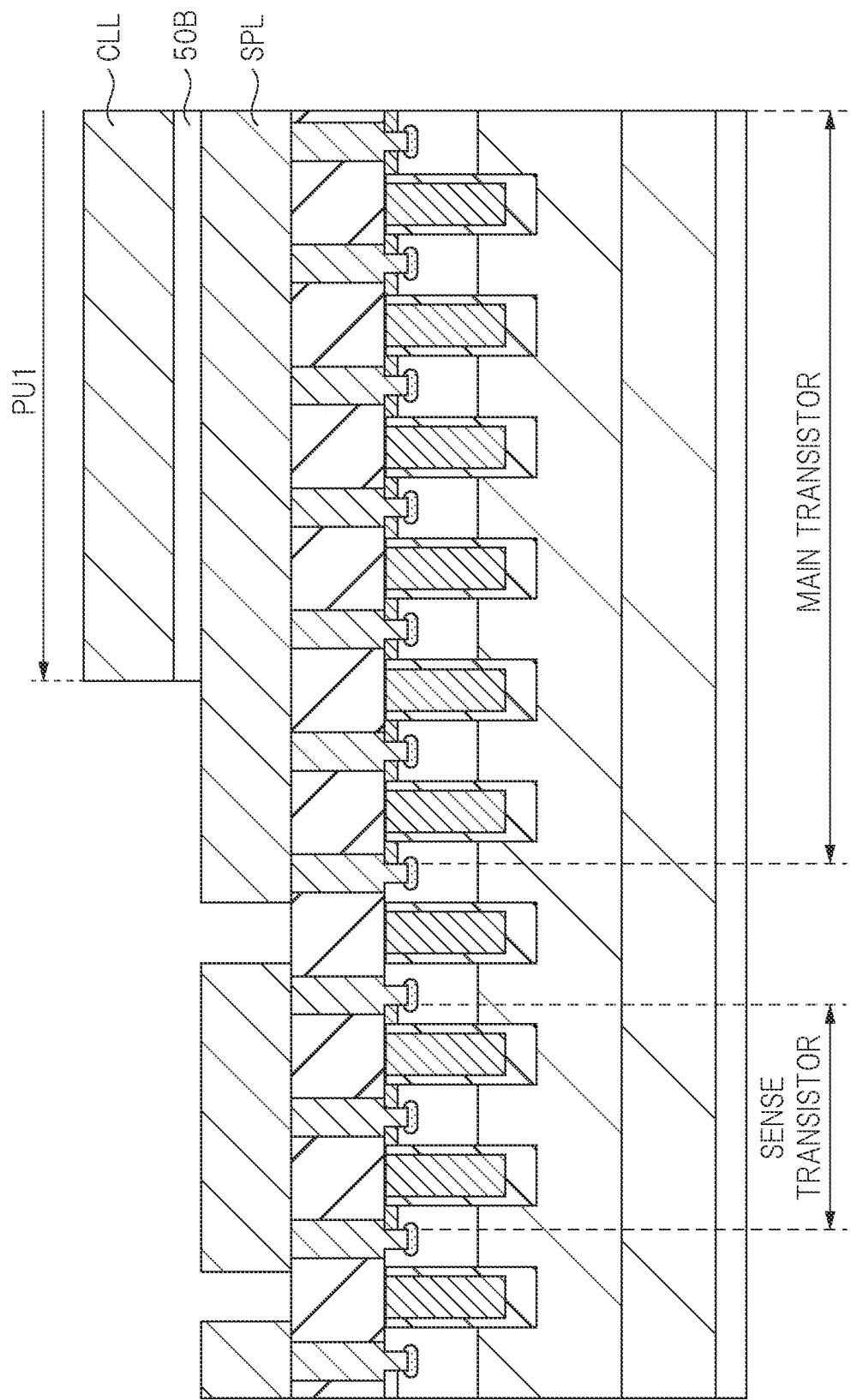
FIG. 9 is a cross-sectional view taken along the line A-A in FIG. 8.

Next, FIG. 9 is a cross-sectional view taken along the line A-A in FIG. 8.

As shown in FIG. 9, the main transistor and the sense transistor are composed of vertical trench power transistors which flow a current in the thickness direction of the semiconductor chip.

Also, the main transistor is electrically connected to the source pad. SPL for main transistor, and the source pad SPL for main transistor is connected to the clip CLL via the silver paste 50B. On the other hand, the sense transistor is electrically connected to the sense pad 200.

<<Feature in Embodiment>>

Next, the feature in the present embodiment will be described.

The feature in the present embodiment lies in that the sense transistor 100 is arranged in the region sandwiched between the tip portion of the clip CLL and the first short side SS1 of the source pad SPL for main transistor in a plan view as shown in FIG. 8. In this way, according to the present embodiment, for example, even if the peeled portion of the silver paste that adheres the source pad SPL for main transistor and the clip CLL increases or decreases by performing the reliability test called "HTSL", the sense transistor 100 is less likely to be affected by the potential change due to the increase or decrease of the peeled portion. This is because, according to the new finding found by the inventors of this application, the region sandwiched between the tip portion of the clip CLL and the first short side SS1 of the source pad SPL for main transistor is located away from the peeled portion of the silver paste and is the "position that is less likely to be affected by the potential change due to the increase or decrease of the peeled portion of the silver paste". Namely, in the present embodiment, with respect to the basic idea of forming the sense transistor 100 at the position that is less likely to be affected by the potential change due to the increase or decrease of the peeled portion of the silver past, the above-mentioned basic idea is embodied by the configuration in which the sense transistor 100 is arranged in the region sandwiched between the tip portion of the clip CLL and the first short side SS1 of the source pad SPL for main transistor in a plan view, based on the above-mentioned new finding. As a result, according to the configuration in the present embodiment that has embodied the basic idea, the fluctuation of the sense ratio can be suppressed, so that the detection accuracy of the current flowing through the main transistor can be improved. Namely, according to the configuration in the present embodiment, it is possible to suppress the deterioration of the performance of the semiconductor device such as the decrease of the detection accuracy of the main current due to the fluctuation of the sense ratio.

First Modification

Figure 10:
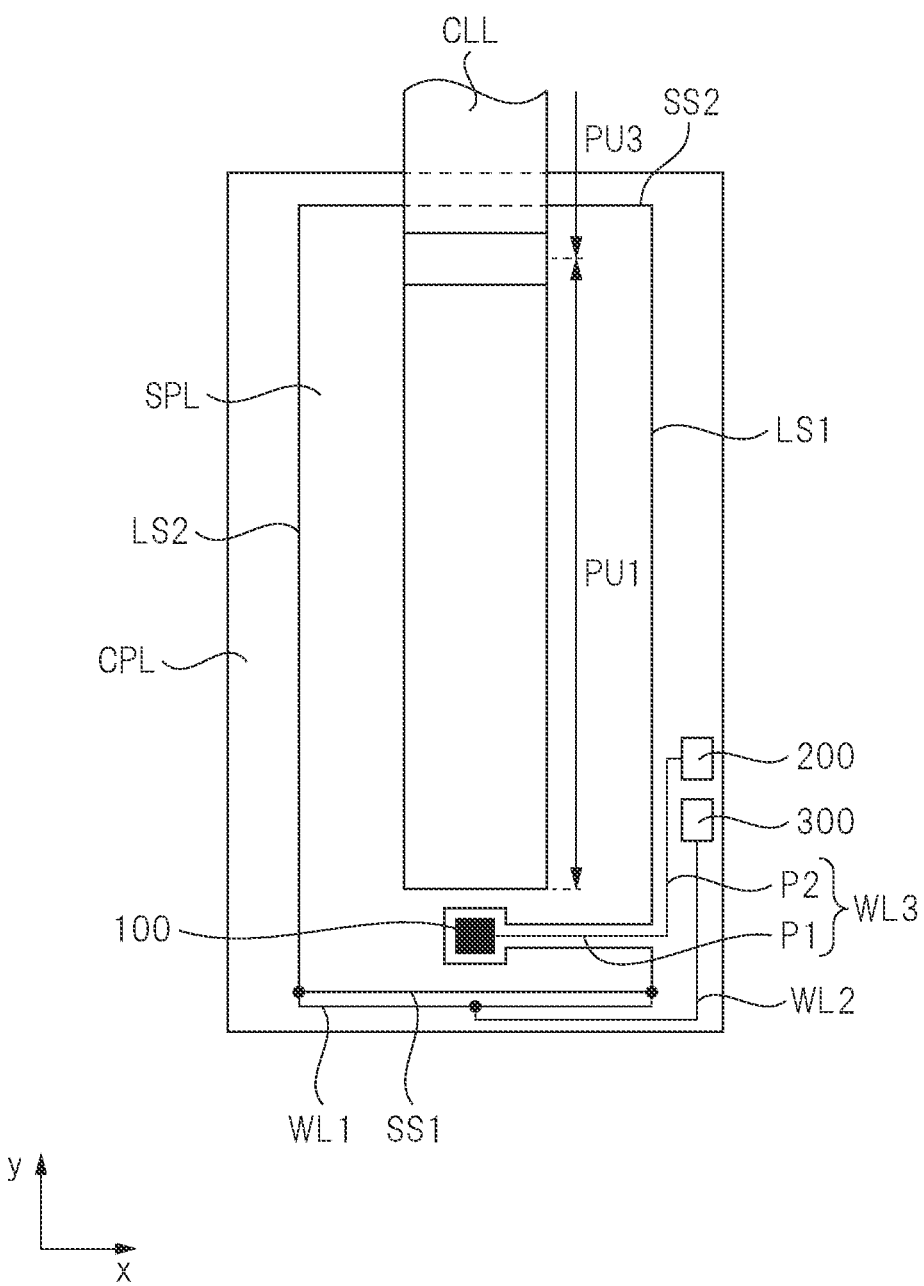
FIG. 10 is a diagram showing a first modification.

FIG. 10 is a diagram showing a first modification.

As shown in FIG. 10, in the first modification, the source pad SPL for main transistor and pad 300 are connected via the first wiring WL1 that connects the first corner portion where the first long side LS1 and the first short side SS1 intersect and the second corner portion where the second long side LS2 and the first short side SS1 intersect and the second wiring WL2 that connects the first wiring WL1 and the pad 300.

Further, in the first modification, the sense transistor 100 and the sense pad 200 are connected by the third wiring WL3, and the third wiring WL3 has a first portion P1 arranged along the first short side SS1 and a second portion P2 arranged along the first long side LS1.

Also in the first modification configured in this way, the sense transistor 100 is arranged in the region sandwiched between the tip portion of the clip CLL and the first short side SS1 of the source pad SPL for main transistor a an view. Accordingly, also in the first modification, for example, even if the peeled portion of the silver paste that adheres the source pad SPL for main transistor and the clip CLL increases or decreases by performing the reliability test called "HTSL", the sense transistor 100 is less likely to be affected by the potential change due to the increase or decrease of the peeled portion. As a result, it is possible to suppress the fluctuation of the sense ratio also in the first modification.

Second Modification

Figure 11:
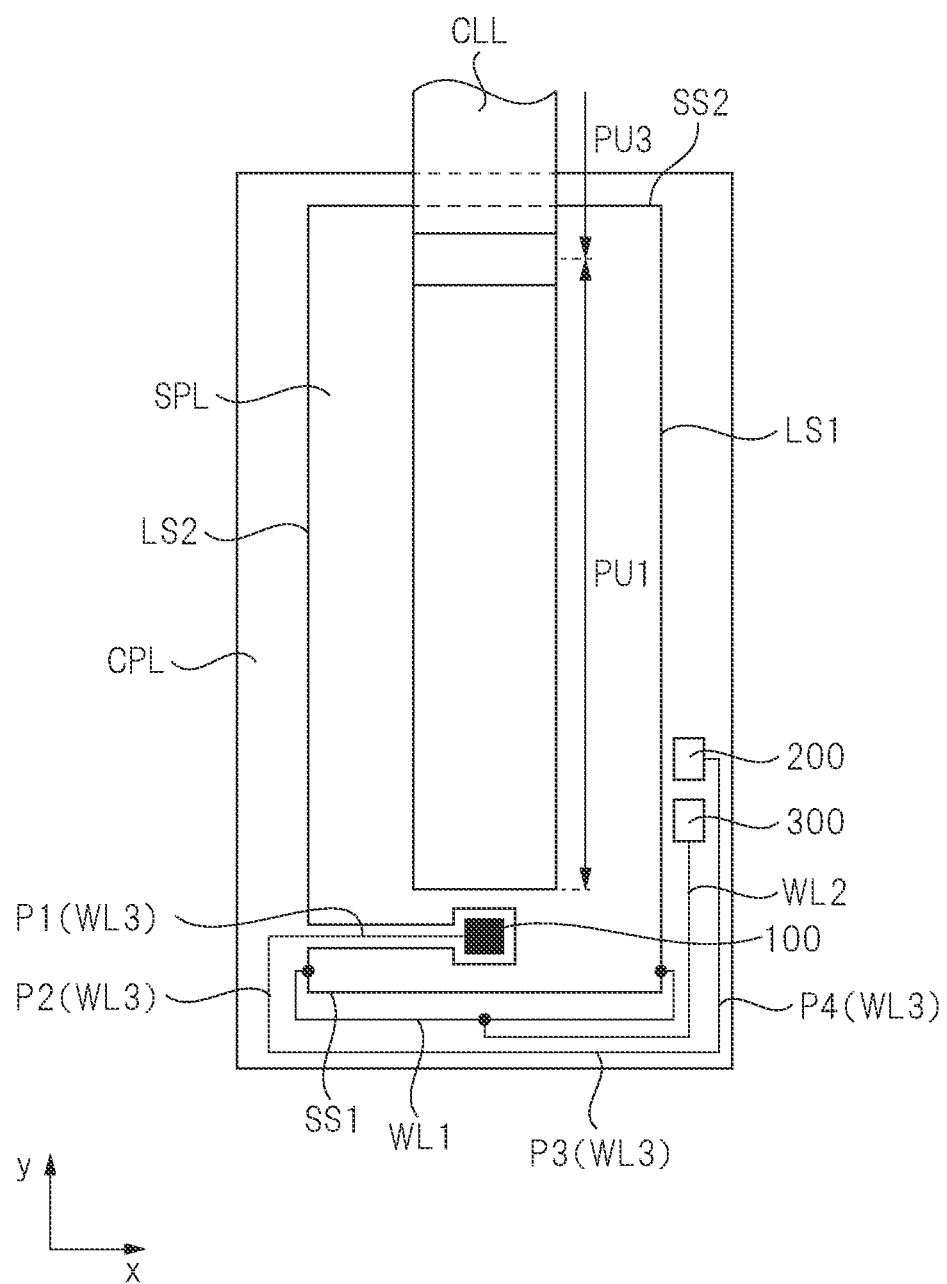
FIG. 11 is a diagram showing a second modification.

FIG. 11 is a diagram showing a second modification.

As shown in FIG. 11, in the second modification, the source pad SPL for main transistor and the pad 300 are connected via the first wiring WL1 that connects the first long side LS1 and the second long side LS2 of the source pad SPL for main transistor and the second wiring WL2 that connects the first wiring WL1 and the pad 300. Also, the sense transistor 100 and the sense pad 200 are connected by the third wiring WL3, and the third wiring WL3 has a first portion P1 arranged along the first short side SS1 and intersecting the second long side LS2, a second portion P2 arranged along the second long side LS2, a third portion P3 arranged along the first short side SS1, and a fourth portion P4 arranged along the first long side LS1 in a plan view.

Also in the second modification configured in this way, the sense transistor 100 is arranged in the region sandwiched between the tip portion of the clip CLL and the first short side SS1 of the source pad SPL for main transistor in a plan view. Accordingly, also in the second modification, for example, even if the peeled portion of the silver paste that adheres the source pad SPL for main transistor and the clip CLL increases or decreases by performing the reliability test called "HTSL", the sense transistor 100 is less likely to be affected by the potential change due to the increase or decrease of the peeled portion. As a result, it is possible to suppress the fluctuation of the sense ratio also in the second modification.

Third Modification

Figure 12:
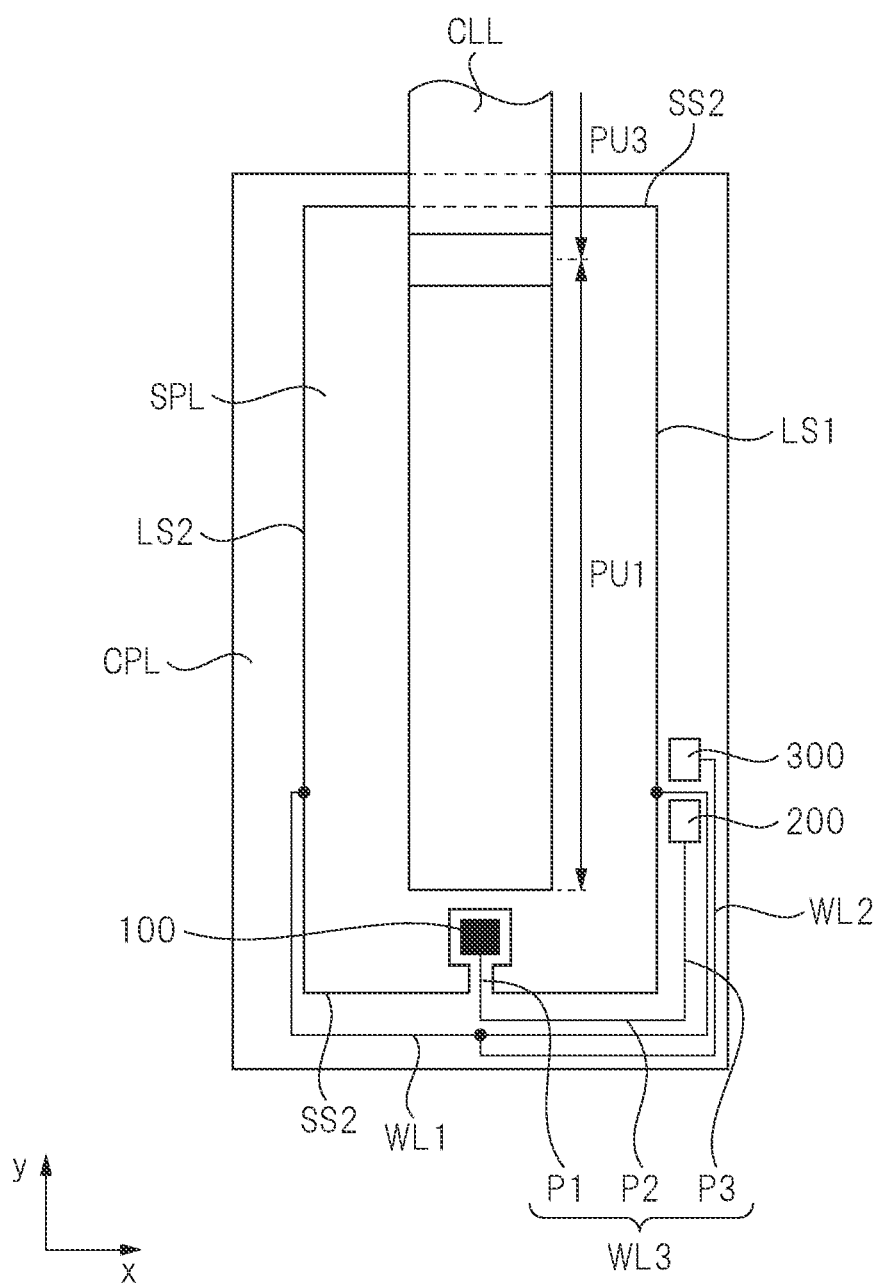
FIG. 12 is a diagram showing a third modification.

FIG. 12 is a diagram showing a third modification.

As shown in FIG. 12, the source pad SPL for main transistor and the pad 300 are connected via the first wiring WL1 that connects the first long side LS1 and the second long side LS2 of the source pad SPL for main transistor and the second wiring WL2 that connects the first wiring WL1 and the pad 300. Also, the sense transistor 100 and the sense pad 200 are connected by the third wiring WL3, and the third wiring WL3 has a first portion P1 arranged along the first long side LS1 and intersecting the first short side SS1, a second portion P2 arranged along the first short side SS1, and a third portion P3 arranged along the first long side LS1 in a plan view.

Also in the third modification configured in this way, the sense transistor 100 is arranged in the region sandwiched between the tip portion of the clip CLL and the first short side SS1 of the source pad SPL for main transistor a an view. Accordingly, also in the third modification, for example, even if the peeled portion of the silver paste that adheres the source pad SPL for main transistor and the clip CLL increases or decreases by performing the reliability test called "HTSL", the sense transistor 100 is less likely to be affected by the potential change due to the increase or decrease of the peeled portion. As a result, it is possible to suppress the fluctuation of the sense ratio also in the third modification.

Fourth Modification

In the embodiment, for example, as shown in FIG. 8, with respect to the basic idea of forming the sense transistor 100 at the position that is less likely to be affected by the potential change due to the increase or decrease of the peeled portion of the silver past, the above-mentioned basic idea is embodied by the configuration in which the sense transistor 100 is arranged in the region sandwiched between the tip portion of the clip CLL and the first short side SS1 of the source pad SPL for main transistor in a plan view. However, the above-mentioned basic idea can be embodied not only by the configuration in which the sense transistor 100 is arranged in the region sandwiched between the p portion of the clip CLL and the first short side SS1 of the source pad SPL for main transistor but also by the configuration shown in FIG. 13. This is because, according to the study by the inventors of this application, it has been found that the growth of the peeled portion of the silver paste is less likely to occur not only at the tip portion of the clip CLL but also at the root portion. Namely, the root portion of the clip CLL is also the position that is less likely to be affected by the potential change due to the increase or decrease of the peeled portion of the silver paste, and it is possible to suppress the fluctuation of the sense ratio also by arranging the sense transistor 100 at this position.

Figure 13:
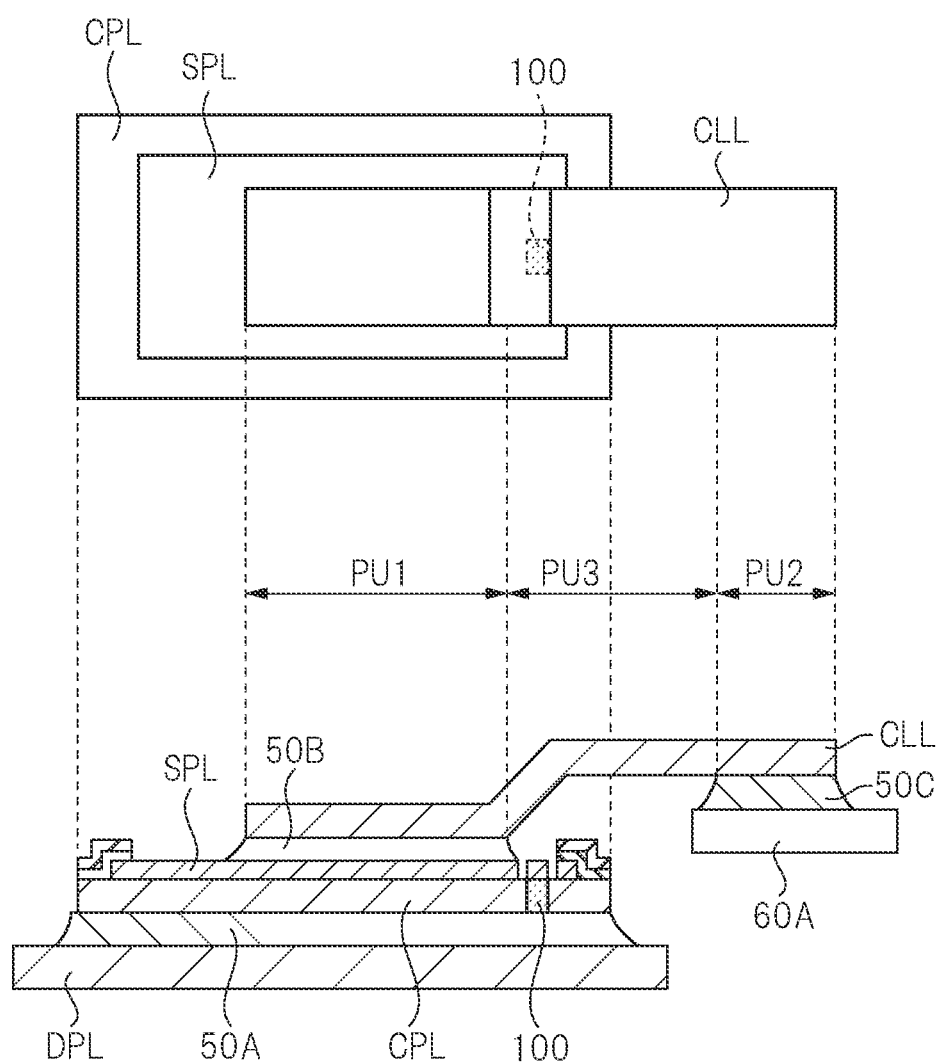
FIG. 13 is a diagram showing a fourth modification.

Specifically, FIG. 13 is a diagram showing a fourth modification.

As shown in FIG. 13, the semiconductor chip CPL has an overlapping region in which the source pad SPL for main transistor and the clip CLL overlap with each other and a non-overlapping region in which the source pad SPL for main transistor and the clip CLL do not overlap with each other in a plan view.

Then, the clip CLL has a first portion PU1 in contact with the silver paste 50B, a second portion PU2 in contact with the silver paste 50C, and a third portion PU3 located between the first portion PU1 and the second portion PU2. Here, the overlapping region includes a region which overlaps with the third portion PU3 of the clip CLL in a plan view and in which the sense transistor 100 is arranged. Namely, in the fourth modification, the sense transistor 100 is formed in the region overlapping with the third portion P3 of the clip CLL in a plan view, in the semiconductor chip CPL.

Namely, the overlapping region includes the first region which overlaps with the third portion of the clip CLL (plate-shaped member) in a plan view and in which the sense transistor 100 is arranged. In other words, the sense transistor 100 is located in the first region of the overlapping region which overlaps with the third portion of the clip CLL (plate-shaped member) in a plan view.

Also in the fourth modification configured in this way, even if the peeled portion of the silver paste that adheres the source pad SPL for main transistor and the clip CLL increases or decreases by performing the reliability test called "HTSL", the sense transistor 100 is less likely to be affected by the potential change due to the increase or decrease of the peeled portion. As a result, it is possible to suppress the fluctuation of the sense ratio also in the fourth modification, <Method of Manufacturing Semiconductor Device>

Next, the method of manufacturing the semiconductor device according to the present embodiment will be described.

<<Manufacturing Process of Semiconductor Device>>

First, a semiconductor wafer having a plurality of chip regions is prepared. Then, by using the normal semiconductor manufacturing technology, power transistors including a main transistor and a sense transistor are formed in each chip region. At this time, for example, the main transistor and the sense transistor are formed such that the layout shown in FIG. 8 is realized. Thereafter, a source pad for main transistor is formed on the surface of each chip region of the semiconductor wafer. The source pad for main transistor is made of, for example, aluminum.

Next, if necessary, a plating film such as a nickel film, a palladium film, or a gold film is formed on the exposed surface of the source pad for main transistor by using an electroless plating method or the like. Then, after performing the back surface grinding process to the semiconductor wafer, the semiconductor wafer is diced. As a result, the plurality of chip regions of the semiconductor wafer is singulated and divided into a plurality of semiconductor chips. In this way, the semiconductor chip according to the present embodiment is manufactured.

<<Assembly Process of Semiconductor Device>>

Next, the assembly process of the semiconductor device will be described.

Figure 14:
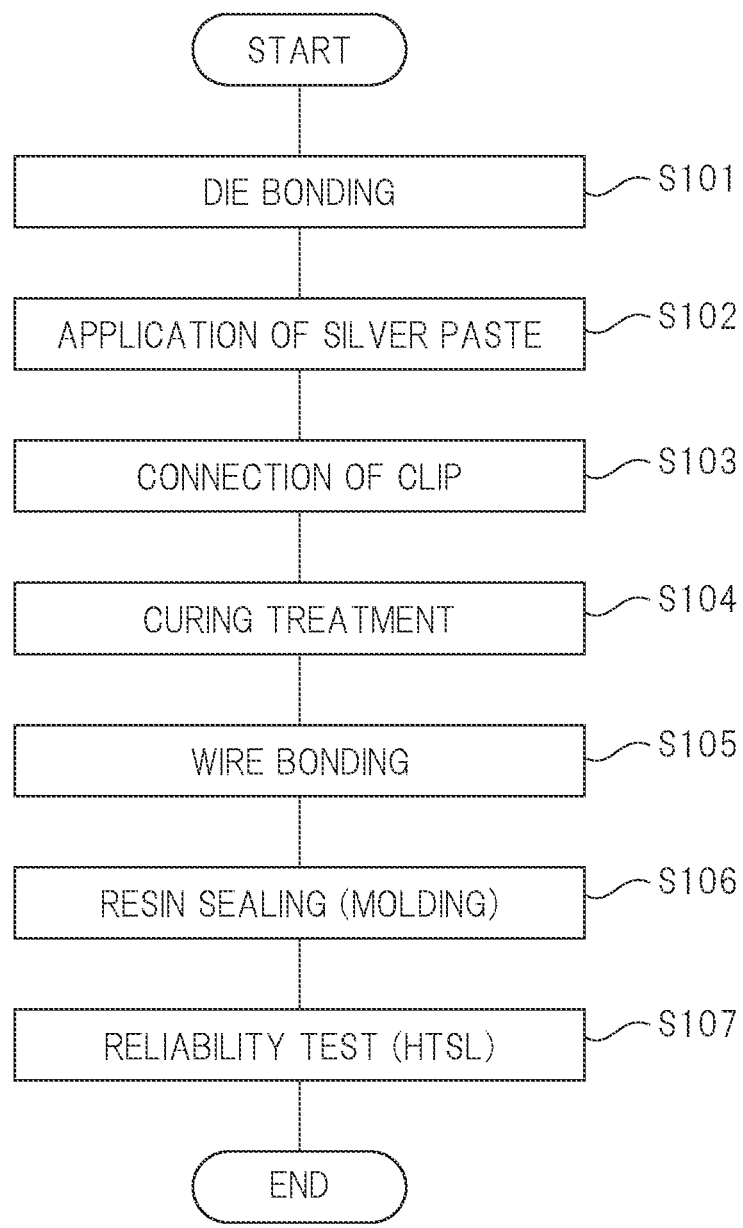
FIG. 14 is a flowchart for describing an assembly process of the semiconductor device.

FIG. 14 is a flowchart showing the assembly process of the semiconductor device.

First, a lead frame having a die pad and a lead separated from the die pad is prepared. Then, the semiconductor chip manufactured in the above-mentioned manufacturing process of the semiconductor chip is mounted on the die pad. Specifically, after applying a silver paste on the die pad, the semiconductor chip is mounted on the die pad via the silver paste (S101).

Next, a silver paste is applied on the source pad for main transistor formed on the surface of the semiconductor chip and on the lead (S102). Thereafter, the clip is arranged so as to connect the source pad for main transistor and the lead. At this time, the clip is connected to the source pad for main transistor via the silver paste and is connected to the lead via the silver paste. As a result, the source pad for main transistor and the lead are electrically connected by the clip (S103). Then, a curing treatment (heat treatment at about 150° C. to 300° C.) for curing the silver paste is performed (S104).

Subsequently, for example, the lead and other pads formed on the surface of the semiconductor chip are connected by a gold wire or a conductive wire. Namely, the wire bonding with a gold wire or a copper wire is performed to the lead and other pads formed on the surface of the semiconductor chip (S105).

Thereafter, a sealing body is formed by performing resin sealing (molding) (S106). Then, a plating layer is formed on the outer lead portion of the lead exposed from the sealing body as needed. Next, the sealing body is separated from the frame portion of the lead frame by cutting the lead at a predetermined position outside the sealing body. Subsequently, the outer lead portion of the lead protruding from the sealing body is bent. In this way, the semiconductor device can be manufactured.

Thereafter, the reliability test called "HTSL" is performed to the manufactured semiconductor device (S107). At this time, the peeled portion of the silver paste that adheres the source pad for main transistor and the clip increases or decreases in some cases. In this regard, in the present embodiment, the sense transistor is formed at the position that is less likely to be affected by the increase or decrease of the peeled portion of the silver paste (for example, region sandwiched between the tip portion of the clip CLL and the first short side SS1 of the source pad SPL for main transistor). As a result, in the semiconductor device according to the present embodiment, the fluctuation of the sense ratio can be suppressed, so that the detection accuracy of the current flowing through the main transistor can be improved. Namely, according to the present embodiment, it is possible to suppress the deterioration of the performance of the semiconductor device such as the decrease in the detection accuracy of the main current clue to the fluctuation of the sense ratio. Thus, according to the present embodiment, the manufacturing yield of the semiconductor device can be improved.

Thereafter, among the manufactured semiconductor devices, non-defective products that have passed the above-mentioned reliability test are shipped. In this way, the method of manufacturing the semiconductor device according to the present embodiment is implemented.

Fifth Modification

In the above embodiment, the configuration in which the surface of the die pad DPL (die pad DPC, die pad DPH) is exposed from the lower surface of the sealing body MR has been described as an example, but the basic idea in the embodiment is not limited to this and can be applied to, for example, the configuration in which the surface of the die pad DPL (die pad DPC, die pad DPH) is exposed from the upper surface of the sealing body MR.

In the case of the configuration of the fifth modification, the resin sealing step (molding step) can be performed in the configuration in which the exposed surface of the die pad DPL is in contact with the lower mold or the configuration in which the exposed surface of the die pad DPL is in contact with the lower mold.

In the foregoing, the invention made by the inventors of this application has been specifically described based on the embodiment, but it goes without saying that the present invention is not limited to the embodiment described above and can be modified within the range not departing from the gist thereof.

In the above embodiment, as shown in FIG. 8, an example in which the source pad SPL for main transistor has a rectangular shape in a plan view has been described, but the basic idea in the above embodiment is not limited to this, and can be widely applied to the case in which the planar shape of the source pad SPL for main transistor has an approximately rectangular shape (deformed shape) having at least a first short side, a second short side facing the first short side, a first long side intersecting the first short side, and a second long side facing the first long side as shown in FIG. 6A and FIG. 6B.

In the embodiment described above, a power MOSFET is assumed as a power transistor formed in a semiconductor chip, but the technical idea in the above embodiment is not limited to this, and can be widely applied to, for example, a semiconductor device using IGBT (insulated Gate Bipolar Transistor) as a power transistor.

In this case, the "source pad for main transistor" should be read as the "emitter pad for main transistor". Also, in claims, the "first electrode" is used as the wording including the "source pad for main transistor" and the "emitter Dad for main transistor". Namely, the "first electrode" described in claims is used with the intention of including the "source pad for main transistor" and the "emitter pad for main transistor".

Further, in the above embodiment, silver paste has been described as an example, but the technical idea in the above embodiment is not limited to this, and can be widely applied to, for example, a semiconductor device using solder. Also, in claims, the "first conductive member" or the "second conductive member" is used as the wording including the "silver paste" and the "solder". Namely, the "first conductive member" or the "second conductive member" described in claims is used with the intention of including the "silver paste" and the "solder".

What is claimed is:

1. A semiconductor device comprising:
a die pad;
a semiconductor chip mounted on the die pad;
a lead arranged separately from the die pad; and
a plate-shaped member electrically connecting the semiconductor chip and the lead to each other,
wherein the semiconductor chip includes:
 a power transistor; and
 a sense transistor for detecting a current flowing through the power transistor,
wherein a first electrode electrically connected to the power transistor and a second electrode electrically connected to the sense transistor are formed on a surface of the semiconductor chip,
wherein the first electrode has: in a plan view,
 a first short side;
 a second short side facing the first short side;
 a first long side intersecting the first short side; and
 a second long side facing the first long side,
wherein the semiconductor chip has: in the plan view,
 an overlapping region in which the first electrode and the plate-shaped member overlap with each other; and
 a non-overlapping region in which the first electrode and the plate-shaped member do not overlap with each other,
wherein the plate-shaped member extends in a first direction in which the first long side extends so as to cross the second short side in the plan view, is electrically connected to the first electrode via a first conductive member, and is electrically connected to the lead via a second conductive member,
wherein the plate-shaped member includes:
 a first portion with which the first conductive member is in contact;
 a second portion with which the second conductive member is in contact; and
 a third portion located between the first portion and the second portion,
wherein the first portion of the plate-shaped member has: in a plan view,
 a third short side adjacent to the first short side of the first electrode;

a third long side adjacent to the first long side of the first electrode and intersecting the third short side; and a fourth long side adjacent to the second long side of the first electrode and facing the third long side, and wherein the sense transistor is arranged in a first region of the non-overlapping region, the first region being located between the third short side of the first portion of the plate-shaped member and the first short side of the first electrode in the plan view.

2. The semiconductor device according to claim 1, wherein a third electrode electrically connected to the first electrode is further formed on the surface of the semiconductor chip.

3. The semiconductor device according to claim 2, wherein the first electrode and the third electrode are electrically connected to each other via a first wiring which connects the first long side and the second long side and a second wiring which connects the first wiring and the third electrode.

4. The semiconductor device according to claim 3,
wherein the sense transistor and the second electrode are electrically connected to each other via a third wiring, and wherein the third wiring includes:
a first portion arranged along the first short side; and
a second portion arranged along the first long side and connected to each of the first portion and the second electrode.

5. The semiconductor device according to claim 2, wherein the first electrode and the third electrode are electrically connected to each other via a first wiring which connects a first corner portion where the first long side and the first short side intersect and a second corner portion where the second long side and the first short side intersect and a second wiring which connects the first wiring and the third electrode.

6. The semiconductor device according to claim 5,
wherein the sense transistor and the second electrode are electrically connected to each other via a third wiring, and wherein the third wiring includes:
a first portion arranged along the first short side; and
a second portion arranged along the first long side and connected to each of the first portion and the second electrode.

7. The semiconductor device according to claim 2,
wherein the first electrode and the third electrode are electrically connected to each other via a first wiring which connects the first long side and the second long side and a second wiring which connects the first wiring and the third electrode, wherein the sense transistor and the second electrode are electrically connected to each other via a third wiring, and wherein the third wiring includes: in the plan view,
a first portion arranged along the first short side;
a second portion arranged along the second long side and connected to the first portion;
a third portion arranged along the first short side and connected to the second portion; and
a fourth portion arranged along the first long side and connected to each of the third portion and the second electrode.

8. The semiconductor device according to claim 2,
wherein the first electrode and the third electrode are electrically connected to each other via a first wiring which connects the first long side and the second long side and a second wiring which connects the first wiring and the third electrode, wherein the sense transistor and the second electrode are electrically connected to each other via a third wiring, and wherein the third wiring includes: in the plan view,
a first portion arranged along the first long side;
a second portion arranged along the first short side and connected to the first portion; and
a third portion arranged along the first long side and connected to each of the second portion and the second electrode.

9. The semiconductor device according to claim 1, wherein the first conductive member contains silver.

10. The semiconductor device according to claim 1, wherein the plate-shaped member is a clip made of copper.

11. A semiconductor device comprising:
a die pad;
a semiconductor chip mounted on the die pad;
a lead arranged separately from the die pad; and
a plate-shaped member electrically connecting the semiconductor chip and the lead to each other,
wherein the semiconductor chip includes:
a power transistor; and
a sense transistor for detecting a current flowing through the power transistor,
wherein a first electrode electrically connected to the power transistor and a second electrode electrically connected to the sense transistor are formed on a surface of the semiconductor chip,
wherein the first electrode has: in a plan view,
a first short side;
a second short side facing the first short side;
a first long side intersecting the first short side; and
a second long side facing the first long side,
wherein the semiconductor chip has: in a plan view,
an overlapping region in which the first electrode and the plate-shaped member overlap with each other; and
a non-overlapping region in which the first electrode and the plate-shaped member do not overlap with each other,
wherein the plate-shaped member extends in a first direction in which the first long side extends so as to cross the second short side in the plan view, is electrically connected to the first electrode via a first conductive member, and is electrically connected to the lead via a second conductive member,
wherein the plate-shaped member includes:
a first portion with which the first conductive member is in contact;
a second portion with which the second conductive member is in contact; and
a third portion located between the first portion and the second portion, and
wherein the sense transistor is arranged in a first region of the overlapping region, the first region overlapping with the third portion of the plate-shaped member in the plan view.

* * * * *